United States Patent
Neely et al.

(10) Patent No.: US 12,262,464 B2
(45) Date of Patent: Mar. 25, 2025

(54) METHODS FOR FORMING ENGINEERED THERMAL PATHS OF PRINTED CIRCUIT BOARDS BY USE OF REMOVABLE LAYERS

(71) Applicant: TTM TECHNOLOGIES INC., Santa Ana, CA (US)

(72) Inventors: Matthew D. Neely, Santa Ana, CA (US); Michael Len, Santa Ana, CA (US); King Yip Leung, Santa Ana, CA (US)

(*) Notice: Subject to any disclaimer, the term of this patent is extended or adjusted under 35 U.S.C. 154(b) by 0 days.

(21) Appl. No.: 17/543,512

(22) Filed: Dec. 6, 2021

(65) Prior Publication Data

US 2022/0183141 A1    Jun. 9, 2022

Related U.S. Application Data

(60) Provisional application No. 63/123,400, filed on Dec. 9, 2020.

(51) Int. Cl.
*H05K 3/42*    (2006.01)
*H05K 1/02*    (2006.01)
(Continued)

(52) U.S. Cl.
CPC .......... *H05K 1/0206* (2013.01); *H05K 1/115* (2013.01); *H05K 3/0026* (2013.01);
(Continued)

(58) Field of Classification Search
CPC ...... H05K 3/0047; H05K 3/422; H05K 3/423; H05K 2203/1572; H05K 3/0094;
(Continued)

(56) References Cited

U.S. PATENT DOCUMENTS 5,982,619 A    11/1999    Ginnatto et al.
2006/0141762 A1    6/2006    Khandekar et al.
(Continued)

FOREIGN PATENT DOCUMENTS

CN    104582234 A    4/2015
JP    2009060152 A  *  3/2009
(Continued)

OTHER PUBLICATIONS

Ye et al., "Investigation of Wet-Etching- and Multiinterconnection-Based TSV and Application in 3-D Hetero-Integration," in IEEE Transactions on Components, Packaging and Manufacturing Technology, vol. 4, No. 10, pp. 1567-1573, Oct. 2014. (Year: 2014).*
(Continued)

*Primary Examiner* — A. Dexter Tugbang
(74) *Attorney, Agent, or Firm* — TTM Technologies Inc.

(57) ABSTRACT

A method for forming a thermal and electrical path in a PCB may include forming a first removable layer over a top surface of a PCB and a second removable layer over a bottom surface of the PCB. The method may also include milling or laser drilling the PCB from the top surface to form a first cavity extending into the PCB, plating the first side panel plating the first side with a second metal to partially fill the first cavity; and milling or laser drilling from the bottom surface to form a second cavity extending into the PCB, the first cavity in a thermal communication and/or an electrical communication with the second cavity. The method may also include panel plating the first side with a second metal to fill the first cavity and the second side with the second metal to fill the second cavity, and removing the first and second removable layers from the PCB to form the PCB with a thermal and/or an electrical path comprising the first cavity and the second cavity filled with the second metal.

17 Claims, 5 Drawing Sheets

(51) Int. Cl.
*H05K 1/11* (2006.01)
*H05K 3/00* (2006.01)

(52) U.S. Cl.
CPC ............ *H05K 3/0047* (2013.01); *H05K 3/422* (2013.01); *H05K 3/423* (2013.01); *H05K 3/0038* (2013.01); *H05K 2203/0542* (2013.01); *H05K 2203/072* (2013.01); *H05K 2203/0723* (2013.01); *H05K 2203/1572* (2013.01)

(58) Field of Classification Search
CPC .................. H05K 3/421; H05K 3/0038; H05K 2203/0542; H05K 2203/072; H05K 2201/10545; H05K 3/4697; H05K 1/0206; H05K 1/115; H05K 3/0206; H05K 2203/0723
See application file for complete search history.

(56) References Cited

U.S. PATENT DOCUMENTS

| | | |
|---|---|---|
| 2007/0034519 A1 | 2/2007 | Chinda et al. |
| 2008/0119041 A1 | 5/2008 | Magera et al. |
| 2009/0260868 A1* | 10/2009 | Oh .................... H05K 3/423 174/262 |
| 2011/0056734 A1 | 3/2011 | Andrews et al. |
| 2011/0155439 A1* | 6/2011 | Yamada ................ H05K 3/421 29/852 |
| 2012/0039010 A1* | 2/2012 | Tresness ............... H05K 3/0038 361/112 |
| 2012/0246925 A1 | 10/2012 | Hibino et al. |
| 2012/0261166 A1 | 10/2012 | Oh et al. |
| 2013/0143420 A1 | 6/2013 | Light et al. |
| 2013/0319737 A1 | 12/2013 | Hurwitz |
| 2014/0151107 A1 | 6/2014 | Weng et al. |
| 2015/0287901 A1 | 10/2015 | Lorimer et al. |
| 2015/0319842 A1 | 11/2015 | Asano et al. |
| 2016/0143129 A1 | 5/2016 | Min et al. |
| 2016/0227641 A1 | 8/2016 | Ku et al. |
| 2016/0316563 A1 | 10/2016 | Sidhu et al. |
| 2016/0316565 A1* | 10/2016 | Chen .................... H05K 3/4697 |
| 2016/0338202 A1 | 11/2016 | Park et al. |
| 2016/0381781 A1 | 12/2016 | Park |
| 2017/0233886 A1* | 8/2017 | Jayaraju ............ H05K 2203/072 205/131 |
| 2019/0014667 A1 | 1/2019 | Bahl et al. |

FOREIGN PATENT DOCUMENTS

| | | |
|---|---|---|
| JP | 2013135168 A | 7/2013 |
| JP | 2014075498 A | 4/2014 |
| WO | 2019060817 A2 | 3/2019 |

OTHER PUBLICATIONS

European Search Report issued on May 10, 2022 to related EP Application No. 21212926.6 (8 pages).
Chinese Patent Application No. 202180001137.7 Office Action issued Sep. 27, 2023, 29 pages.
European Application No. 21747188.7 European Search Report dated Feb. 2, 2024, 9 pages.

* cited by examiner

METHODS FOR FORMING ENGINEERED THERMAL PATHS OF PRINTED CIRCUIT BOARDS BY USE OF REMOVABLE LAYERS

CROSS-REFERENCE TO RELATED PATENT APPLICATIONS

This patent application claims the benefit under 35 U.S.C. § 119(e) of U.S. Patent Application Ser. No. 63/123,400, entitled "Devices and Methods for Forming Engineered Thermal Paths of Printed Circuit Boards By Use of Secondary Conductive Layers," filed on Dec. 9, 2020, which is incorporated herein by reference in its entirety.

FIELD

The disclosure is directed to forming a thermal path including thermal cavities in printed circuit board assemblies by using a horizontal plating system and removable layers.

BACKGROUND

Printed Circuit Board Assemblies (PCBAs) include Printed Circuit Board(s) (PCB) with Surface Mount (SMT) components soldered to the surface of the PCB(s). The SMT components dissipate power. A primary thermal path is through the PCB to a heat sink (HS). A thermal conductivity is a measure of a material's ability to conduct heat, and is a material property. The thermal conductivity of typical PCB dielectric materials ranges from 0.25 W/mK to 3 W/mK, which results in a high thermal resistance through the PCB and consequently generates a large temperature delta in the PCBs. The high thermal resistance needs to be lowered to reduce the large temperature delta.

To improve the thermal path through PCBs, thermal vias may be added around the power dissipating components. A conventional way of the thermal vias is accomplished by adding Plated Through Holes (PTHs) under and around the SMT components. The method is referred to as a PTH approach. The PTHs are filled with copper, which has a thermal conductivity of about 390 W/mK that is much higher than that of the PCB, for example, 0.025 W/mk to 3 W/mk. The closer the PTHs can be positioned together, the lower the thermal resistance of the PCB would be. Based on manufacturing design rules, the standard minimum distance between drilled holes or the PTHs is one drill diameter.

When Integrated Circuits (ICs) become more power hunger, coupled with the trend of miniaturization, the thermal management on the PCB becomes bigger challenges. The PTH approach may not reduce the thermal resistance sufficiently for applications that dissipate significant power. When the thermal vias are not sufficient to improve the thermal path, pre-fabricated copper coins may be inserted into the PCB to improve the thermal path and help conduct the heat away from heat sources, such as integrated circuits (IC), die, or SMT components, among others, to a heat sink underneath the PCB. Inserting a pre-fabricated coin is a labor-intensive manual process. In this process, a hole can be cut in the PCB and the pre-fabricated coin (e.g. commonly formed of copper) is inserted into the PCB, which is referred to as a coin approach. The manufacturing of PCBs with the pre-fabricated coins is very labor intensive and consequently expensive. Usually the coin approach is cost prohibitive except for use in low volume high performance assemblies. Additionally, there is a tolerance stack up issue with inserted coins. Each of the coins and the PCB has a thickness with a thickness tolerance. Both the coins and the PCB have thickness variations independently from lot to lot. Another limitation of the inserted coins is that the coins have limited connection or no connection to the PCB ground. Electrical ground connections are critical for radio frequency (RF) and high speed digital applications.

There remains a need to address the limitations and manufacturing issues of thermal vias and inserted pre-fabricated coins.

BRIEF SUMMARY

In an aspect, a method is provided for forming a thermal and electrical path in a PCB. A method for forming a thermal and electrical path in a PCB may include forming a first removable layer over a top surface of a PCB and a second removable layer over a bottom surface of the PCB. The method may also include milling or laser drilling the PCB from the top surface to form a first cavity extending into the PCB, seed plating a first side including the top surface and the first cavity of the PCB with a first metal to form a first conductive coating, plating the first side panel plating the first side with a second metal to partially fill the first cavity; and milling or laser drilling from the bottom surface to form a second cavity extending into the PCB, the first cavity in a thermal communication and/or an electrical communication with the second cavity. The method may also include seed plating a second side including the bottom surface and the second cavity of the PCB with a second metal to form a second conductive coating. The method may also include panel plating the first side with a second metal to fill the first cavity and the second side with the second metal to fill the second cavity, and removing the first and second removable layers from the PCB to form the PCB with a thermal and/or an electrical path comprising the first cavity and the second cavity filled with the second metal.

In some variations, the seed plating may include electroless plating.

In another aspect, a method is provided for forming a thermal and electrical path in a PCB. The method may include drilling through a first removable layer to form a drilled or milled portion, forming the first removable layer over a top surface of a PCB and a second removable layer over a bottom surface of the PCB, milling or laser drilling the PCB from the top surface to form a first cavity extending into the PCB, plating a first side including the top surface and the first cavity of the PCB with a first metal, panel plating the first side to partially fill the first cavity with a second metal. The method may also include milling or laser drilling the PCB from the bottom surface to form a second cavity extending into the PCB, the first cavity in a thermal communication and/or an electrical communication with the second cavity. The method may also include plating a second side including the bottom surface and the second cavity of the PCB with the first metal, and panel plating the first side to form a first plated metal layer on a first exposed surface of the PCB and the second side with the second metal to form a second plated metal layer on a second exposed surface of the PCB and to fully fill the first cavity and the second cavity.

The method may also include milling the first plated metal layer near the drilled portion of the first removable layer to a first controlled depth in the first removable layer to form a conductive trace having a pattern defined by the drilled portion of the first removable layer. The method may also include removing the first and second removable layers from the PCB to expose the conductive trace and form the PCB comprising the conductive trace protruded on the top surface and a thermal and electrical path comprising the first cavity and the second cavity filled with the second metal.

In a further embodiment, the disclosure provides a printed circuit board (PCB) assembly with a thermal path. The PCB assembly may include a PCB. The PCB may include a first conductive layer having a top surface, and a second conductive layer having a bottom surface. The PCB may also include a thermal path comprising a first cavity in a thermal communication with a second cavity in the PCB and extending from the top surface to the bottom surface, each of the first cavity and the second cavity filled with a respective thermal conductive material. The PCB may further include one or more conductive traces exposed or protruding from the top surface or the bottom surface.

Additional embodiments and features are set forth in part in the description that follows, and will become apparent to those skilled in the art upon examination of the specification or may be learned by the practice of the disclosed subject matter. A further understanding of the nature and advantages of the disclosure may be realized by reference to the remaining portions of the specification and the drawings, which form a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein:

FIG. 10 depicts an enlarged view of mill operation for a second side at step (L) of FIG. 1A according to an embodiment;

DETAILED DESCRIPTION

Figure 1A:
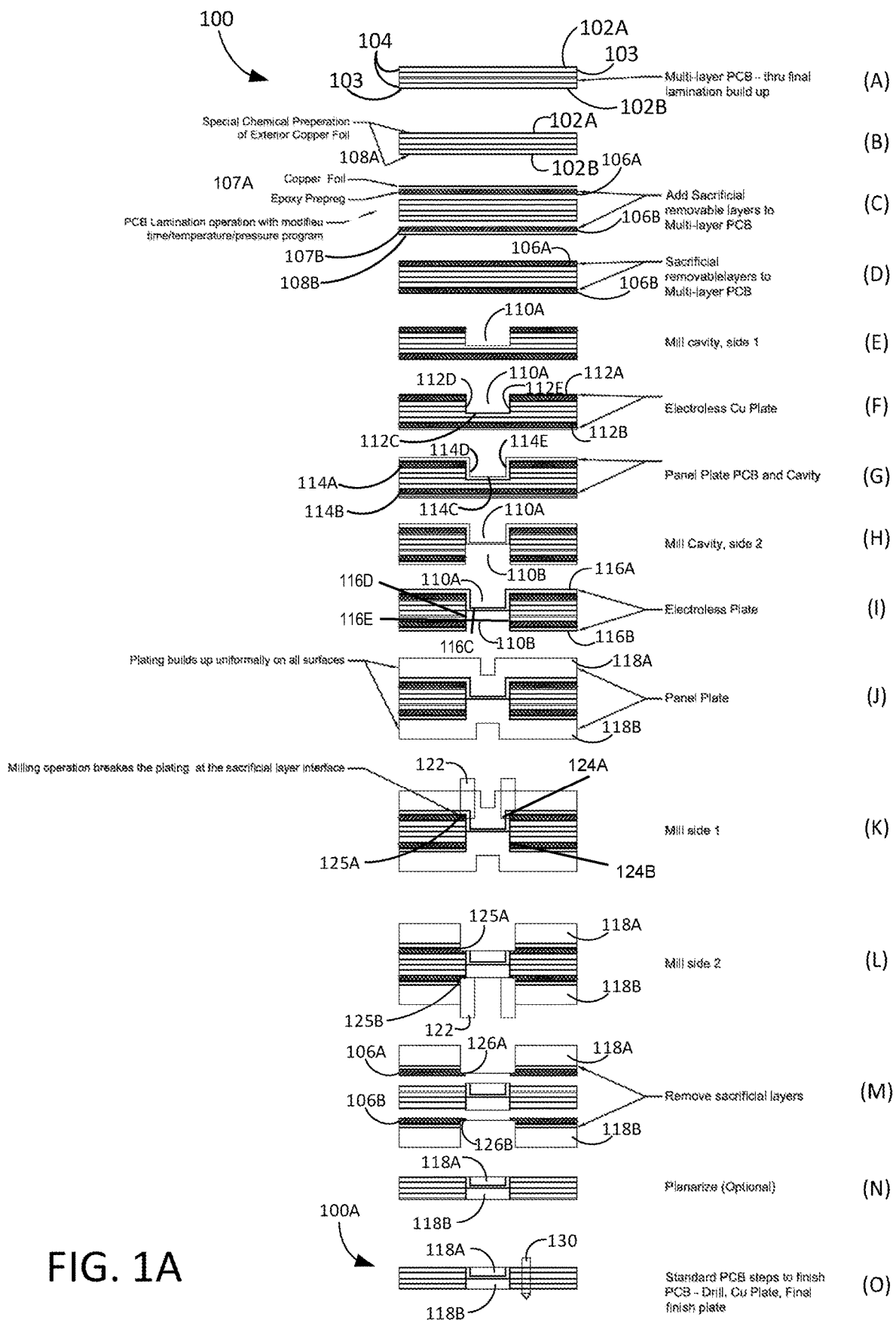
FIG. 1A depicts a process using secondary or removable conductive layers for forming cavities and a thermal path and/or an electrical path in a PCB according to a first embodiment.

The disclosure may be understood by reference to the following detailed description, taken in conjunction with the drawings as described below. It is noted that, for purposes of illustrative clarity, certain elements in various drawings may not be drawn to scale.

The disclosure provides methods for creating large metal features (e.g. thermal cavities filled with copper) within a PCB by using a horizontal and/or vertical plating system without metal build-up on the top and bottom layers of the PCB. The methods shield the top and bottom surfaces of the PCB from metal plating build-up (e.g. copper plating build-up) when a high current density (>=20 amp/sq ft) plating system is used. The high current density plating system may also be referred to as a horizontal plating system. The methods utilize removable conductive layers to provide a pathway to drive currents and to shield exterior surfaces of the PCB, e.g. top and bottom metal layers, during an electroplating process.

The removable layers can use conventional PCB materials and adhere to the PCB using a reduced strength lamination procedure. The removable layers adhere to the top and bottom surfaces of a PCB prior to copper plating. The removable layers are removed to form the finished product of the PCB.

The disclosed methods facilitate high deposition rates without generating the build-up of plating on unwanted surfaces. The disclosed methods replace the coins with plated thermal cavities, which is a less costly process than the coin approach. The plated thermal cavities also have reduced height variation to the PCB as compared to the coin approach. Additionally the plated cavities also have improved electrical connection to the PCB ground layers, which is important for high speed digital and RF performance.

This patent application is related to the following patent applications, each of which is incorporated herein by reference in its entirety: U.S. patent application Ser. No. 16/435,174 entitled "METHODS FOR FABRICATING PRINTED CIRCUIT BOARD ASSEMBLIES WITH HIGH DENSITY VIA ARRAY," by Michael Len et al., filed on Jun. 7, 2019; and U.S. Provisional Application 62/968,807 entitled "PRINTED CIRCUIT BOARD ASSEMBLIES WITH ENGINEERED THERMAL PATHS AND METHODS FOR MANUFACTURE," by Rick Bauer et al., filed on Feb. 11, 2020.

U.S. application Ser. No. 16/435,174 and 62/968,807 disclose producing an improved thermal path through the PCB by creating a solid continuous copper feature void free, which improves thermal performance, similar to the coin approach. In the improved thermal path, a front cavity and a backside cavity are first filled with copper by plating. The cavities are then milled and/or laser drilled and then plated up. The improved thermal path is formed by using a vertical plating system or a horizontal plating system for pattern plating with resist or mask. The process includes (1) create the first cavity from the top surface to approximately the center of the PCB depth, and plate the first cavity either partially or fully; (2) Flip the PCB over and create the second cavity from the bottom surface into the first copper filled cavity, and plate the second cavity. The filling materials in the cavities may have thermal conductivity ranging from 0.25 W/mK to 1200 W/m K.

Production copper plating systems for PCBs include a vertical type of system and a horizontal type of system. The vertical type of system is more common than the horizontal type of system. A vertical copper plating system is suitable for plating a uniform thickness on all exposed conductive surfaces of a PCB. In the vertical copper plating system, a nonconductive layer is applied to a surface of the PCB to mask areas. The nonconductive layer is often referred to as a resist or a mask. When the resist is used to protect areas or regions of the PCB from plating build-up, the plating is referred to as pattern plating. The mask is commonly a dry film formed of a photopolymer. With the pattern plating, copper builds up around any openings, overhanging the resist.

A horizontal copper plating system utilizes a chemical solution that facilitates faster copper deposition due to higher current density than the vertical plating system, but plates on all surfaces of the PCB. Consequently, the horizontal copper plating system cannot do pattern plating as the vertical copper plating system does, but only does panel plating, which does not use resist, and plates the entire PCB. In addition, the rate of copper plating is controlled by the current density to the exposed copper surface. The current density for the horizontal copper plating system is greater than 20 amp/square foot (sq. ft.), which is much higher than that for the vertical copper plating system, which is less than 15 amp/sq. ft. In some variations, the horizontal copper plating system may be greater than 80 amp/square foot (sq. ft.). Therefore, the horizontal copper plating system provides increased plating rate deposition or shorter plating time with a tradeoff of plating all surfaces including both conductive and non-conductive surfaces.

There are issues with making large solid copper features, including long plating time and copper plating accumulation around cavity or on surface. Plating large thick areas of copper typically takes a long time with the conventional copper plating processes. As disclosed above, the horizontal copper plating system has much shorter plating time than the vertical copper plating system due to the higher current density achievable. However, the horizontal copper plating can only do panel plating, but does not do pattern plating. In the panel plating, the entire surface of the PCB including holes and cavities are plated up and metal (e.g. copper) builds up on all surfaces of the PCB.

By using the horizontal copper plating system, the copper plating accumulation or build-up is removed by using the disclosed processes using removable layers.

It will be appreciated by those skilled in the art that other conductive materials may be used in the horizontal and vertical plating systems, for example, nickel (Ni), tin (Sn), silver (Ag) or gold (Au), among others. Ag has higher thermal and electrical conductivities than copper (Cu), but is more costly than Cu. The thermal and electrical conductivities of Cu are better than Au. Ni and Sn can also be used, but have lower thermal and electrical conductivities than Cu and Au. In some embodiments, any material that will plate to Cu can be used. It is desirable to use a material having a combination of high thermal conductivity, high electrical conductivity and low cost. In some variations, the material that can bond to Cu or plate to Cu may be used, including conductive paste, nanoparticle filled materials, silver-filled epoxy, among others.

Processes

FIG. 1A depicts a process using secondary or removable layers for forming cavities and a thermal and an electrical path in a PCB according to a first embodiment. As shown, the process includes manufacturing a PCB stop before a final exterior layer etching (i.e. stop after final lamination build-up) at step (A). As shown, a PCB 100 containing multiple layers 103 and 104 is provided. The PCB 100 includes a top surface 102A and a bottom surface 102B. In one aspect, the top and bottom layers 103 are conductive. For example, the top and bottom layers 103 can be copper foils. The layers 104 adjacent to the top and bottom layers 103 are insulating layers, for example, formed of fiber-reinforced glasses embedded in epoxy.

The process also includes typical pre-bonding PCB surface preparation of exterior copper foil at step (B) including, but not limited to, pre-bonding chemistries on the exposed copper foil of the PCB.

The process also includes adding secondary layers including epoxy prepreg and copper foils to the PCB at step (C). The secondary layers are also referred to as sacrificial removable layers or sacrificial layers or removable layers. As shown, a first removable layer 106A includes an upper copper foil 108A disposed over an upper fiber-reinforced prepreg layer 107A which is added to the top surface 102A of the PCB 100. A second removable layer 106B includes a lower copper foil 108B disposed under a lower fiber-reinforced prepreg layer 107B, which is added below the bottom surface 102B of the PCB 100. The lamination temperature and pressure may be reduced from a product recommended procedure to produce a reduced strength bond. The profile modifications may vary depending on the prepreg material and pre-bonding surface preparation process.

In some embodiments, various methods may be used to attach the removable layer. In one embodiment, an epoxy prepreg is used to attach the removable layer to the PCB. In alternative embodiments, the thermoplastic and/or the heat release tape options may be viable for attaching the removable layer to the PCB.

The copper foils provide the electrical conductivity of the first and second removable layers, or make the removable layers conductive. The conductive removable layers provide a pathway to drive currents and to shield exterior surfaces of the PCB, e.g. top and bottom metal layers, during an electroplating process.

The removable layers can have enough bonding to the PCB such that the removable layers can survive the subsequent processes including milling and plating. The removable layers are also capable of being peeled off easily from the PCB. The removable layer can have a conductive portion, but the removable layer does not have to be conductive. The removable layer can be plated over.

In some variations, the fiber-reinforced prepreg layer may be formed of an epoxy prepreg with FR-4.

In some variations, the removable layer may include a thermoplastic material.

In some variations, the removable layer may include a heat release material, or a heat release tape.

In some variations, clearance holes may be drilled and or milled in the removable layer prior to joining with the PCB to expose portions of the PCB for plating.

The process also includes laminating the removable layers including epoxy prepreg and copper foils to the top and bottom surfaces of the PCB with modified profiles for time, temperature, and pressure at step (D). The depth of the cavity can increase with the thickness of the removable layer, but may make the plating more difficult when the thickness increases. Thinner removable layers can be used, but may make it more difficult to set the milling height during the separation process. In some variations, the thickness of the removable layer may vary from 1 to 10 mils, among others.

Next, mechanical drilling and/or milling or laser drilling the top side cavity is performed to partially extend through the PCB and pass the centerline of the PCB at step (E). As shown, a top cavity 110A is drilled, milled, or otherwise formed to extend into the PCB from the top surface 102A. The mill or drill operation for the cavity is done after joining the removable layer to the PCB, which provides the support to the removable layer. The drill operation cuts axially and generates cylindrical holes, while the mill operation can cut both axially and laterally.

After forming the top cavity 110A in the PCB 100, the top side of the PCB 100 is electroless plated with a metal to form a first electroless plated metal layer (e.g. copper) at step (F). The first electroless plated metal layer includes a top portion 112A over the PCB, a bottom portion 112B, side portions 112D and 112E as well as bottom portion 112C in the top cavity 110A. The electroless copper plating creates a uniform layer of metal regardless of the geometry of the surface. Moreover, the electroless copper plating can be applied to non-conductive surfaces.

In some variations, the panel plated layer may have a thickness approximately equal to the thickness of the removable layer 106A or 106B. The top side and cavity are further panel plated or electroplated to form an initial panel plated metal layer, which includes a top portion 114A and a bottom portion 114B of the PCB, and also a bottom portion 114C and side portions 114D-E of the top cavity 110A, at step (G). The initial panel plated metal layer, e.g. plated Cu layer, may be at least 0.002 inches thick, which may be thick enough to provide stability. The panel plating partially fills the top cavity 110A. In some variations, the initial panel plated metal layer may be up to 0.006 inches thick, among others. In some variations, the initial panel plating layer may vary from 0.002 inches to 0.008 inches. The electroplating is a process that creates a metal coating on a solid substrate (e.g. PCB) through the reduction of cations of the metal by applying an electric current. The part to be functions acts as a cathode (i.e. negative electrode) of an electrolytic cell. An electrolyte is a solution of a salt of the metal to be coated. An anode (i.e. positive electrode) is formed of the metal, or an inert conductive material. The electric current is provided by an external power supply. The electroplating may suffer from uneven current density due to the effects of the substrate shape on the electric field at its surface.

It will be appreciated that other conductive materials, for example, silver, gold, nickel, tin, among others, may be used in the electroless plating and electroplating. In some variations, any metal or material that will plate to copper can be used. It is desirable that the material have high thermal and electrical conductivity, and low cost.

The PCB or PCB assembly is panel plated by using the horizontal copper plating system. The panel plating uses the electroplating process. The panel plating builds up on all exposed surfaces.

Next, milling or laser drilling the bottom side cavity is performed at step (H). As shown, a bottom cavity 110B is drilled, milled, or otherwise formed to extend into the PCB from the bottom surface 102B. Then, the bottom side of the PCB 100 is electroless plated with a metal to form a second electroless plated metal layer (e.g. copper), which includes a top portion 116A and a bottom portion 116B of the PCB, and also a bottom portion 116C and side portions 116D-E of the bottom cavity 110B, at step (I). The bottom side and the bottom cavity 110B are further panel plated or electroplated to fully fill the top and bottom cavities with plating build-up layers 118A and 118B on the top and bottom sides of the PCB at step (J). The plating build-up layers 118A and 118B are thick enough to fill the top and bottom cavities, unlike the thinner panel-plating layer 114A. In various aspects, the filling material in the top and bottom cavities is copper; however, one or more other filling materials or combinations thereof may be used.

Alternatively, the top cavity and the bottom cavity may be filled with another material, such as epoxy, silver-filled epoxy, or nanoparticle paste, among others. This step would replace the panel plating at step (J).

The process further includes milling the top side to separate the plating at the removable layer interface from the PCB at step (K) and milling the bottom side to separate the plating at the removable layer interface from the PCB at step (L). In other words, the milling can separate or break the first plated metal connection between the PCB and the first removable layer. The drilling stops in the removable layer and does not touch the interface from the PCB. As shown, the drill or router bit 122 cuts into the top plated build-up layer 118A near the top cavity and extends into the upper removable layer 106A to separate the top plated build-up layer 118A near an upper corner region 124A. The drill or router bit 122 also cuts into the bottom plated build-up layer 118B near the bottom cavity and extends into the lower removable layer 106B to separate the top plated build-up layer 118B near a lower corner region 124B.

The disclosed method includes a mill operation after panel plating, which separates the plated copper connection between the PCB and the removable layer. This is accomplished with a controlled depth of the drill or router bit 122, which is a depth of approximately half way through the removable layer.

In some variations, each of the first and second controlled depths is equal to or less than half of the thickness of the removable layer. The controlled depths may be equal to, but not limited to, a sum of half thickness of the PCB, half thickness of the first plating layer, and routing depth of the second cavity or bottom cavity into the first plating layer. For example, the PCB was 100 mils thick, the first plating layer was 6 mils thick, the depth of the bottom cavity milled into the first plating layer was 2 mils, and the controlled depth was thus a sum of 100/2, 6/2, and 2/2, which was equal to 54 mils. This controlled depth can result in equal plating of the top and bottom cavities to achieve the most efficient process.

After milling the cavities, the removable layers 106A-B along with the plating build-up layers 118A-B are removed or peeled off the PCB at step (M). As shown, the removable layers 106A-B have small protruding portions 126A-B extending from the breaking sides 125A-B of the build-up layers 118A-B. Additional isometric view shown in FIG. 2A reveal the detailed breaking of the removable layer from the PCB.

In some variations, electroless plating a first side including the top surface and the first cavity of the PCB with a first metal can be performed prior to milling or laser drilling the PCB from the bottom surface to form the second cavity. The electroless plating provides some conductivity over the surface. Then, electroless plating a second side including the bottom surface and the second cavity of the PCB with a second metal can be performed prior to panel plating the first side with a second metal to fill the first cavity and the second side with the second metal to fill the second cavity.

In some variations, electroless plating a first side including the top surface and the first cavity of the PCB with a first metal and a second side including the bottom surface and the second cavity of the PCB with the first metal can be performed simultaneously prior to panel plating the first side with a second metal to fill the first cavity and the second side with the second metal to fill the second cavity.

Figure 1B:
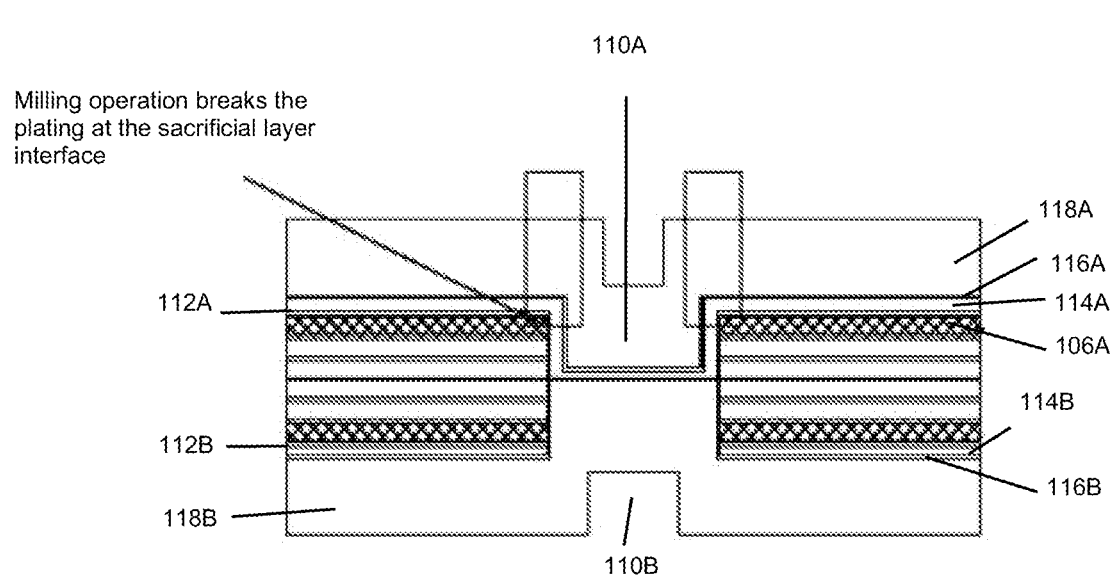
FIG. 1B depicts an enlarged view of mill operation for a first side at step (K) of FIG. 1A according to an embodiment.

FIG. 1B depicts an enlarged view of mill operation for a first side at step (K) of FIG. 1A. As shown in FIG. 1B, an upper stack over the top surface of the PCB 100 includes the panel plated Cu layer 118A adjacent to the electroless plated Cu layer 116A, sequentially followed by the panel plated Cu layer 114A, the electroless plated Cu layer 112A and the removable layer 106A, which is over the top surface of the PCB.

Figure 1C:
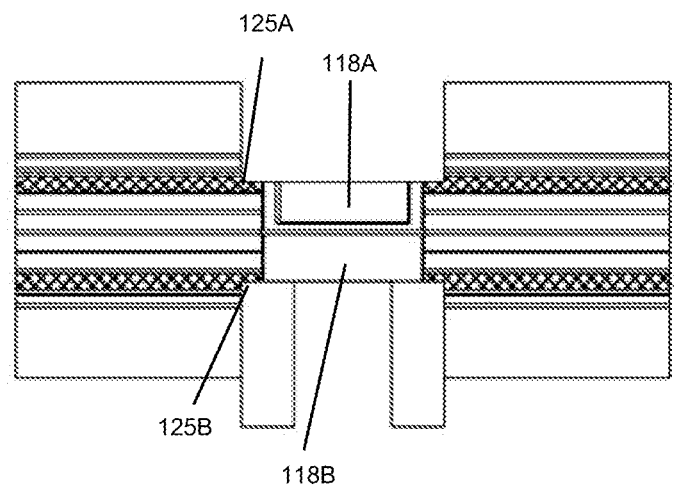

FIG. 1C depicts an enlarged view of mill operation for a second side at step (L) of FIG. 1A. As shown in FIG. 1B, a lower stack under the bottom surface of the PCB 100 includes the secondary conductive layer 106B under the bottom surface of the PCB, sequentially followed by the electroless plated Cu layer 112B, the panel plated Cu layer 114B, the electroless plated Cu layer 116B, and the panel plated Cu layer 118B.

It is desirable to have a flat surface to the PCB for mounting SMT components. Conductive traces and gaps are made as small as possible on the PCB to optimize use of space. Generally, the widths of the traces and gaps may increase with the thickness of the copper layer. Therefore, it is desirable to have thin copper layer for forming fine traces and small gaps. In addition, variations in the thickness of the copper layer may result in variations in etched circuit traces.

Referring to FIG. 1A again, the top and bottom surfaces of the PCB and the exposed surface of the filling material in the top and bottom cavities may be optionally planarized, at step (N), to provide the PCB having uniformly flat surfaces. The PCB is then processed by normal operations to complete manufacturing process drilled, including drilling by drill 130 and plating at step (O). A PCB assembly 100A is formed with a thermal path and/or an electrical path including the top cavity and the bottom cavity, which are filled with plated metal (e.g. copper), e.g. remaining portions of the first and second plated metal layer 118A and 118B, and are joined together to have a thermal communication and/or an electrical communication between them.

Figure 2A:
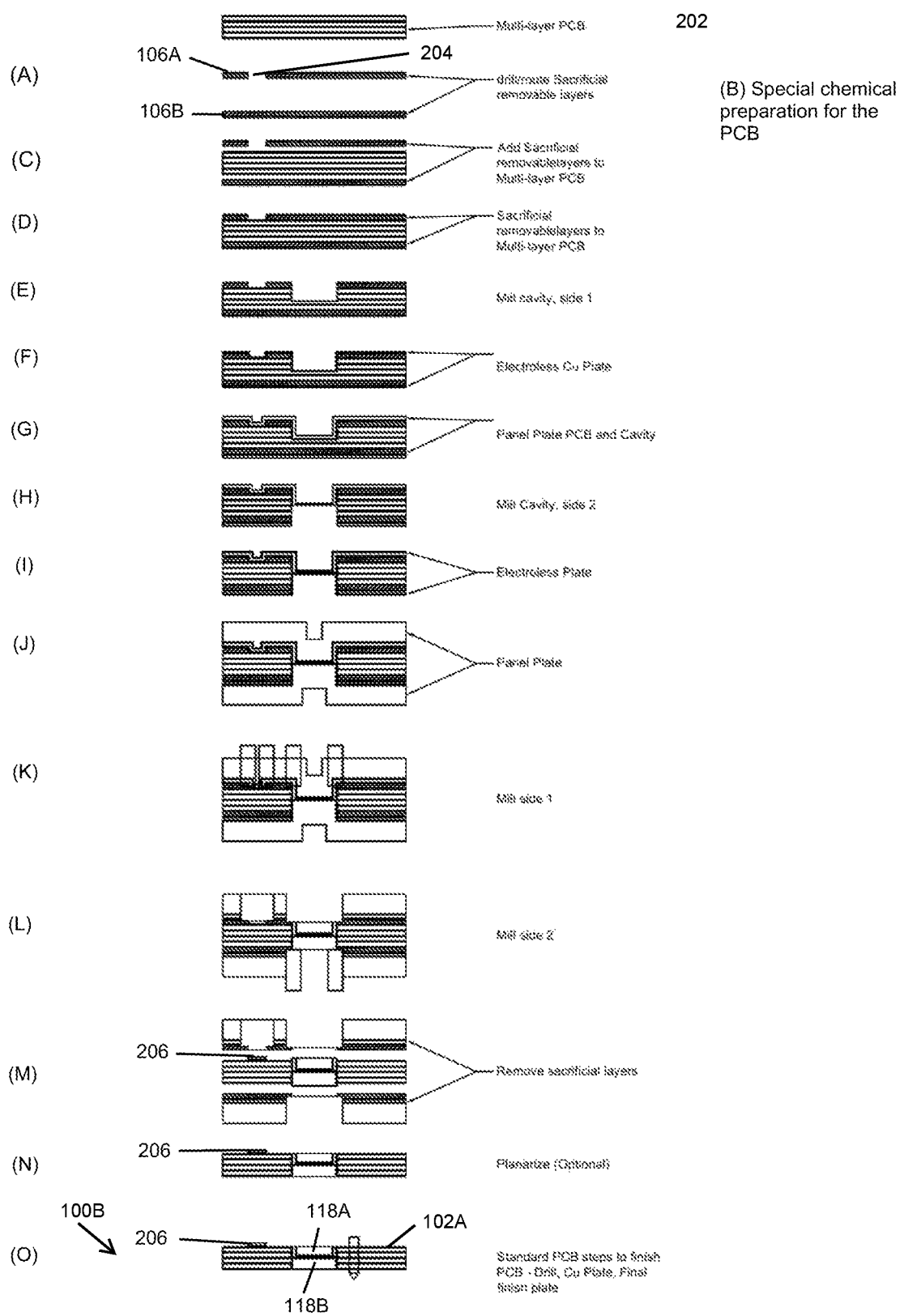
FIG. 2A depicts a process using removable layers for forming cavities and a thermal path and/or an electrical path in a PCB with a conductive trace exposed or protruded on a top surface according to a second embodiment.

In some aspects, an alternative process may be used. FIG. 2A depicts a process using removable layers for forming cavities and a thermal path and/or an electrical path in a PCB with a conductive trace exposed or protruded on a top surface according to a second embodiment. As shown, the alternate process 200 include similar steps (A)-(O) to those described in FIG. 1A with an additional step 202 prior to step (B). The additional step 202 drill or route the top removable layer 106A to form a drilled portion 204, which allows to form a PCB 100B having a conductive trace 206 exposed or protruded on the top surface 102A, and also a thermal path and/or an electrical path including the top cavity and the bottom cavity, which are filled with plated metal (e.g. copper), e.g. remaining portions of the first and second plated metal layer 118A and 118B, and are joined together to have a thermal communication and/or an electrical communication between them.

Figure 2B:
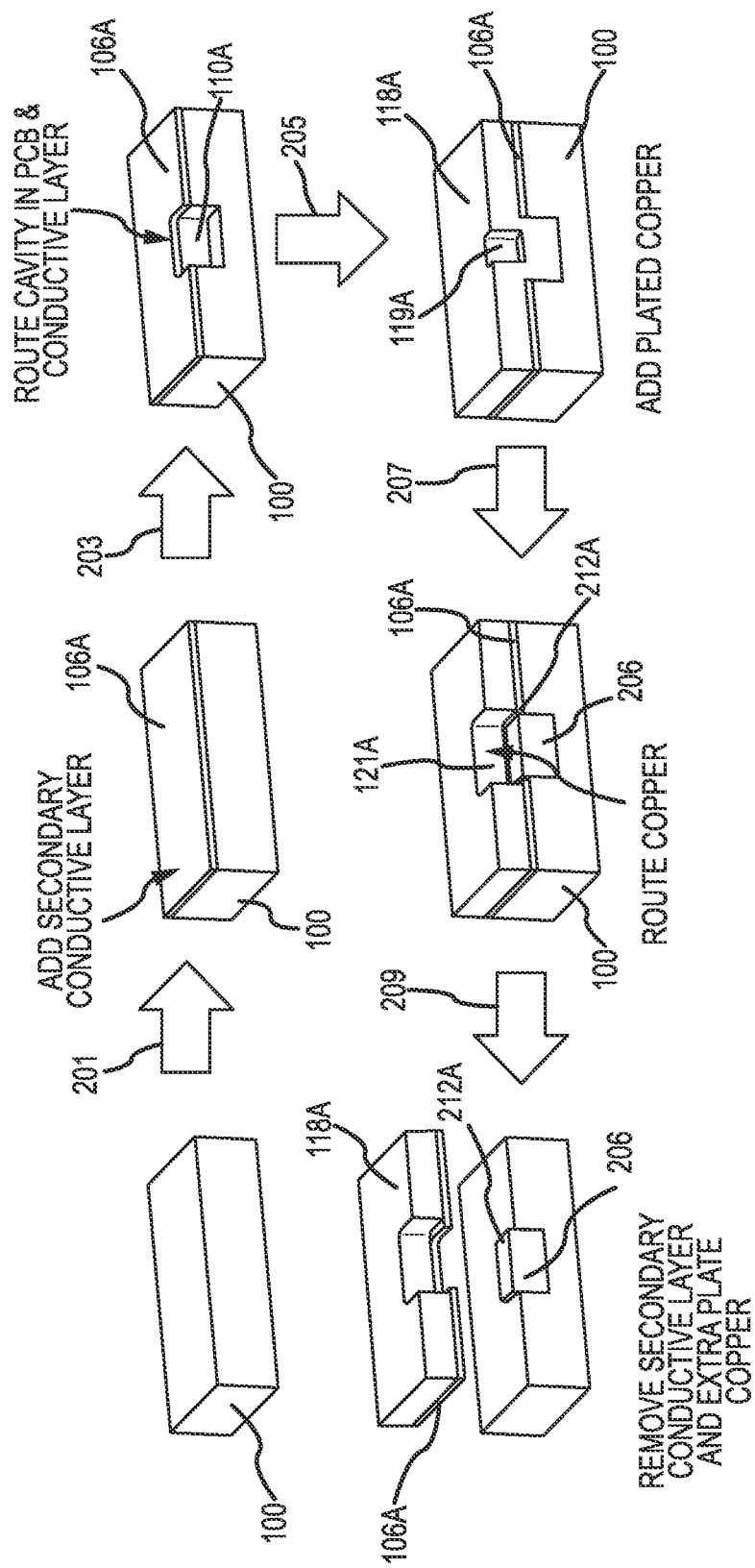
FIG. 2B depicts an isometric sectional view of the process flow of FIG. 2A according to an embodiment.

FIG. 2B depicts an isometric sectional view of the process flow of FIG. 2A to mill a top cavity and remove the top removable layer in an embodiment. As shown, step 201 includes adding a removable layer 106A to the PCB 100. Step 203 routes cavity 110A in the PCB 100 and the removable layer 106A by milling or drilling. Step 205 adds a plated copper layer 118A to the PCB 100 with the cavity 110A. The plated copper layer 118A includes a cavity feature that sits above the cavity 110A in the PCB and the removable layer 106A. Step 207 routes a copper trace or conductive trace 206 by milling to enlarge the cavity 119A to a cavity 121A in the plated copper layer 118A and breaking the copper trace 206 from the removable layer 106A along a U-shaped edge 212A of the copper trace 206. Step 209 removes the removable layer and extra plated copper.

It will be appreciated by those skilled in the art that the top and bottom removable layers can break from the PCB by milling in a similar manner to that illustrated above.

Thermal Path and/or Electrical Path

The thermal path and/or electrical path may have different shapes, which can be created by changing the cavity patterns and can be different from the top to bottom sides, or from front to back sides. Examples include creating a thermal path and/or an electrical path having a "T" shape. It is desirable for the top and bottom cavities to be adjoining or overlapping orientation.

Figure 3:
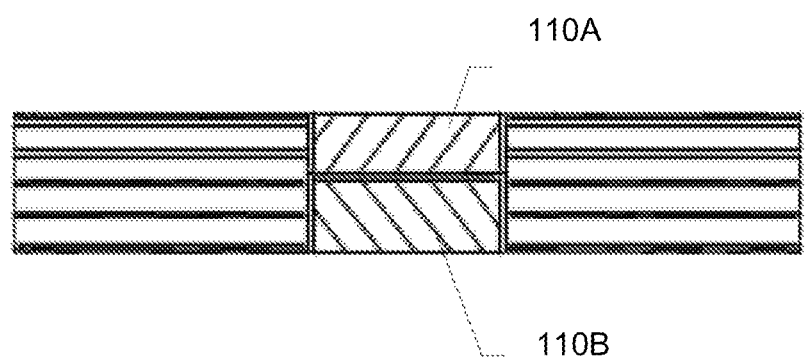
FIG. 3 is a side cross-sectional view of a PCB with a thermal path and/or an electrical path including two cavities of the same dimensions according to one embodiment.
Figure 4:
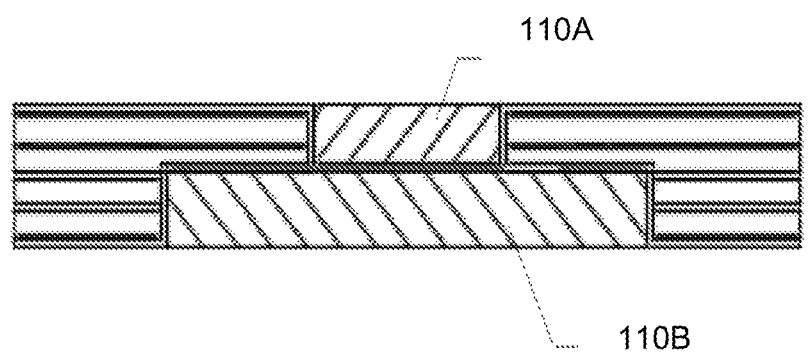
FIG. 4 is a side cross-sectional view of a PCB with a T-shape thermal path and/or an electrical path including two cavities of different dimensions according to one embodiment.

In various aspects, the bottom cavity 110B may have identical in size and shape to the top cavity 110A, as shown in FIG. 3. Alternatively, the bottom cavity 110B may have a different size or shape than the first cavity 110A, as shown in FIG. 4. In various aspects, the top and bottom cavities may have any shape or cross-section, including but not limited to a circle, a square, another quadrilateral, or another polygon shape. It will be appreciated by those skilled in the art that the shape and dimensions in the cavities may vary to obtain various thermal paths and/or electrical paths. Multiple factors may affect the shape and dimensions of the cavities, including PCB dimensions in x, y, and z directions, number of layers, density of traces, sizes of traces, dissipated power on the top side of the PCB, efficiency of heat sink on the bottom side of the PCB, among others.

In various aspects, the filling material in the cavities may be a solid plated copper. In other aspects, the filling materials can be other thermally conductive material, including but not limited to solid silver, or solid gold, other equivalent materials with similar properties or combinations thereof.

The disclosed method is different from a known scheme using a secondary conductive layer to deposit a layer onto a PCB to additively form PCB traces on a PCB, as disclosed in U.S. Pat. No. 7,845,073, entitled "Method of Manufacturing Circuit Board Embedding Thin Film Capacitor," by In Hyung Lee et al., issued on Dec. 7, 2010.

Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%. Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall there between.

What is claimed is:

1. A method of forming a thermal and/or an electrical path in a PCB, the method comprising:
    forming a first removable layer over a top surface of a PCB and a second removable layer over a bottom surface of the PCB;
    milling or laser drilling through both the first removable layer and the PCB from the top surface to form a first cavity extending into the PCB;
    seed plating the PCB including the first cavity with a first seed plating material to form a first conductive coating;
    initial panel plating the PCB with a metal to partially fill the first cavity;

milling or laser drilling through both the second removable layer and the PCB from the bottom surface to form a second cavity extending into the PCB, the first cavity in a thermal communication and/or an electrical communication with the second cavity;

seed plating the PCB including the second cavity with a second seed plating material to form a second conductive coating;

panel plating the PCB with the metal to fully fill the first cavity and the second cavity and form a first plated metal layer on a first exposed surface of the PCB and a second plated metal layer on a second exposed surface of the PCB; and removing the first and second removable layers from the PCB to form the PCB with a thermal and/or an electrical path comprising the first cavity and the second cavity filled with the metal, wherein a cross sectional area of the filled first cavity or the filled second cavity larger than a cross sectional area of through-vias.

2. The method of claim 1, wherein seed plating the PCB including the first cavity or the second cavity comprises electroless plating.

3. The method of claim 1, wherein the thickness of the initial panel plating partially filling the first cavity ranges from 0.002 inches to 0.008 inches.

4. The method of claim 1, wherein the first removable layer comprises a first fiber-reinforced prepreg layer over the top surface of the PCB and a first conductive foil over the first fiber-reinforced prepreg layer, wherein the second removable layer comprises a second fiber-reinforced prepreg layer under the bottom surface of the PCB and a second conductive foil under the second fiber-reinforced prepreg layer.

5. The method of claim 1, the step of removing the first and second removable layers from the PCB comprising:

milling the first plated metal layer and the first removable layer near the first cavity to a first controlled depth in the first removable layer to separate the first plated metal connection between the PCB and the first removable layer;

removing the first removable layer from the PCB along with the remaining portion of the first plated metal layer after milling the first plated metal layer;

milling the second plated metal layer and the second removable layer near the second cavity to a second controlled depth in the second removable layer to separate the second plated metal connection between the PCB and the second removable layer; and removing the second removable layer from the PCB along with the remaining portion of the second plated metal layer after milling the second plated metal layer.

6. The method of claim 5, wherein each of the first and second controlled depths comprises a milled depth into the first or second removable layer that is equal to or less than half of the thickness of the respective first or second removable layer.

7. The method of claim 1, further comprising planarizing the top and bottom surfaces of the PCB after removing the first and second removable layers from the PCB.

8. The method of claim 1, further comprising drilling holes in the PCB to form drilled holes and plating the drilled holes after removing the first and second removable layers from the PCB.

9. The method of claim 1, wherein each of the first and second removable layers comprises a thermoplastic material.

10. The method of claim 1, wherein each of the first and second removable layers comprises a thermoset material.

11. The method of claim 1, further comprising:

drilling through the first removable layer to form a drilled or milled portion; and milling the first plated metal layer near the drilled or milled portion of the first removable layer to a first controlled depth in the first removable layer to form a conductive trace having a pattern defined by the drilled portion of the first removable layer.

12. The method of claim 1, wherein panel plating the PCB comprises panel plating by a horizontal copper plating system to shorten plating time.

13. The method of claim 1, wherein the cross sectional area of the filled first cavity or the filled second cavity is at least two times larger than the cross sectional area of through-vias.

14. The method of claim 1, wherein the filled first cavity or filled second cavity functions as a copper coin.

15. The method of claim 1, wherein the first cavity has the same dimensions as the second cavity.

16. The method of claim 1, wherein the first cavity has a smaller or larger dimension than the second cavity.

17. The method of claim 1, wherein the first cavity has different dimensions from the second cavity such that the thermal path and/or the electrical path have a cross-section having a T-shape.

* * * * *